United States Patent
Hattori et al.

(10) Patent No.: US 7,115,219 B2
(45) Date of Patent: Oct. 3, 2006

(54) METHOD OF PRODUCING INDIUM TIN OXIDE POWDER

(75) Inventors: Takeshi Hattori, Niihama (JP); Shinji Fujiwara, Tsukuba (JP); Kunio Saegusa, Tsukuba-gun (JP)

(73) Assignee: Sumitomo Chemical Company, Limited, Osaka (JP)

( * ) Notice: Subject to any disclaimer, the term of this patent is extended or adjusted under 35 U.S.C. 154(b) by 302 days.

(21) Appl. No.: 10/656,363

(22) Filed: Sep. 8, 2003

(65) Prior Publication Data

US 2004/0140456 A1   Jul. 22, 2004

(30) Foreign Application Priority Data

Sep. 11, 2002  (JP)  ............... 2002-265142

(51) Int. Cl.
  *C01G 19/02* (2006.01)
  *C01G 15/00* (2006.01)
  *C01G 1/02* (2006.01)

(52) U.S. Cl. ............... 252/520.1; 252/518.1; 423/624; 423/92; 423/122

(58) Field of Classification Search ............ 252/520.1, 252/518.1; 423/92, 122, 624; 264/104
See application file for complete search history.

(56) References Cited

U.S. PATENT DOCUMENTS

| | | | | |
|---|---|---|---|---|
| 4,594,182 A | * | 6/1986 | Hashimoto et al. | 252/519.3 |
| 5,580,496 A | * | 12/1996 | Yukinobu et al. | 252/520.1 |
| 6,051,166 A | * | 4/2000 | Fujiwara et al. | 252/520.1 |
| 2002/0153521 A1 | | 10/2002 | Hattori et al. | |

FOREIGN PATENT DOCUMENTS

| | | |
|---|---|---|
| JP | 62-7627 A | 1/1987 |
| JP | 07-21831 A | 1/1995 |
| JP | 07-247162 A | 9/1995 |
| JP | 2000-3618 A | 1/2000 |
| JP | 2000-281337 | * 10/2000 |
| JP | 2000-281337 A | 10/2000 |
| JP | 2001-40434 A | 2/2001 |

* cited by examiner

Primary Examiner—Mark Kopec
Assistant Examiner—Kallambella Vijayakumar
(74) Attorney, Agent, or Firm—Sughrue Mion, PLLC

(57) ABSTRACT

A method of producing an Indium Tin Oxide powder is described. A method of producing an Indium Tin Oxide powder comprising the steps of: (1) mixing a raw aqueous solution containing indium ions and tin ions and having a proportion of divalent tin ions in the tin ions of 50 wt % or more with an alkali aqueous solution, (2) separating the product into solid and liquid, and (3) calcinating the resulted solid.

14 Claims, No Drawings

METHOD OF PRODUCING INDIUM TIN OXIDE POWDER

BACKGROUND OF THE INVENTION

1. Field of the Invention

The present invention relates to a method of producing Indium Tin Oxide (hereinafter, referred to as ITO) powder. More specifically, the present invention relates to a method of producing ITO powder suitable for production of an ITO sintered body of high density.

2. Prior Art

An ITO powder is used for production of an ITO sintered body, and contains tin oxide in an amount of usually from 2 to 20 wt %. An ITO sintered body is used as a target for producing an ITO thin film by a sputtering method. An ITO thin film is utilized, because of its high electric conductivity and excellent transparency, as a transparent electric conductive film for a liquid crystal display.

When a target made of an ITO sintered body of high density is used, an ITO thin film having high electric conductivity can be obtained, therefore, it is known that a high density sintered body having a relative density of 99% or more is suitable as an ITO sintered body used for a target.

Since an ITO sintered body is produced by sintering an ITO powder, an ITO powder giving a high density ITO sintered body is required.

An ITO powder for production of an ITO sintered body is produced by obtaining a precipitate containing indium and tin from an aqueous solution containing indium ions and tin ions, then, filtrating this, and calcinating the resulted precipitate. In conventional methods of producing an ITO powder, an aqueous solution prepared by dissolving $InCl_3$ and tetravalent tin salt $SnCl_4$ in water is used as the aqueous solution containing indium ions and tin ions, an alkali aqueous solution such as ammonia water and the like is dropped on this aqueous solution to obtain a precipitate containing indium and tin, then, this is filtrated, and the resulted precipitate is calcinated to obtain an ITO powder (for example, Japanese Patent Application Laid-Open (JP-A) Nos. 7-21831 and 7-247162). However, ITO powders produced by these methods are not sufficient for production of a high density ITO sintered body.

SUMMARY OF THE INVENTION

An object of the present invention is to provide a method of producing an ITO powder suitable as a raw material for a high density ITO sintered body.

The present inventors have investigated a method of producing an ITO powder, and resultantly completed the present invention.

Namely, the present invention provides a method of producing an Indium Tin Oxide powder comprising the steps of:

(1) mixing a raw aqueous solution containing indium ions and tin ions and having a proportion of divalent tin ions in the tin ions of 50 wt % or more with an alkali aqueous solution, (2) separating the product into solid and liquid, and (3) calcinating the resulted solid.

DETAILED DESCRIPTION OF PREFERRED EMBODIMENTS

Regarding tin ions contained in a raw aqueous solution containing indium ions and tin ions (hereinafter, abbreviated as "raw aqueous solution") in the production method of the present invention, the proportion of divalent tin ions is usually 50 wt % or more, preferably 70 wt % or more, more preferably 80 wt % or more based on the total amount of tin ions contained in a mixed aqueous solution. When the proportion of divalent tin ions is less than 50 wt %, hardly agglomerated particles are obtained in the resulting ITO powder. When an ITO sintered body is produced using this resulted ITO powder, an ITO sintered body having high density cannot be obtained.

The above-mentioned raw aqueous solution can be prepared by dissolving a water-soluble indium salt such as indium chloride ($InCl_3$) and indium nitrate ($In(NO_3)_3$) and a divalent water-soluble tin salt such as stannous chloride ($SnCl_2$) and tin sulfate ($SnSO_4$) in water. The raw aqueous solution may be prepared also by mixing an aqueous solution of an indium salt and an aqueous solution of a tin salt. The aqueous solution of an indium salt is obtained, for example, by the above-mentioned method of dissolving an indium salt in water, and a method of dissolving metal indium in an acid. The aqueous solution of a tin salt is obtained, for example, by the above-mentioned method of dissolving a tin salt in water, and a method of dissolving metal tin in an acid. Further, the raw aqueous solution may be prepared also by dissolving metal indium and metal tin in an acid. As the acid used for dissolution, for example, hydrochloric acid, nitric acid, sulfuric acid and the like are mentioned.

The mixed aqueous solution may be prepared also by a method in which an aqueous solution containing indium ions and tetravalent tin ions is reduction-treated, for example, indium chloride and stannic chloride ($SnCl_4$) are dissolved in water to obtain an aqueous solution containing tetravalent tin ions, and at least a part of tetravalent tin ions contained in this aqueous solution are reduced into divalent ions, or a method in which a substance containing indium, tin and oxygen is dissolved in an acid (hydrochloric acid, nitric acid, sulfuric acid and the like) to obtain an aqueous solution containing tetravalent tin ions, and at least a part of tetravalent tin ions contained in this aqueous solution are reduced into divalent ions, in addition to the above-mentioned preparation methods.

Listed as the substance containing indium, tin and oxygen used in the above-mentioned methods are mixtures of an indium compound such as indium oxide and indium hydroxide with a tin compound such as tin oxide and tin hydroxide, or ITO and the like. Those out of quality standard among ITO powders, those out of quality standard among ITO sintered bodies, cutting wastes of ITO sintered bodies, or ITO sintered bodies removed from a used ITO target used in sputtering, can be used. A method using a used ITO target will be described below.

A used ITO target is usually recovered under a condition in which an ITO sintered body is pasted to a backing plate by indium soldering and the like. The recovered ITO target is heated at about 150 to 200° C., and the ITO sintered body is peeled from the backing plate. It is preferable that the resulted ITO sintered body is washed using an acid. By washing, extraneous substances containing Si, Al, Fe and the like adhered to the surface of an ITO sintered body such as indium solder and the like adhered to an ITO sintered body (this is used for bonding of an ITO sintered body and a backing plate, and sometimes contains Cu, Pb and the like) can be removed.

It is preferable that an ITO sintered body is ground for improving dissolution rate into an acid. Grinding may be advantageously conducted using usually a jaw crasher, roll crasher, disk mill, vibration mill and the like. The material of a part of these grinding machines to be contacted with a ground substance is preferably a ceramic such as alumina, zirconia, tungsten carbide and the like. It is not preferable that the material of a part of these grinding machines to be contacted with a ground substance is a metal other than indium and tin since then the metal adheres to the ITO sintered body after grinding to cause pollution and it becomes unnecessary to remove metal impurities from an acidic solution obtained by dissolving an ITO sintered body in an acid. The size of the ITO sintered body after grinding is preferably 20 mm or less, further preferably 2 mm or less, most preferably 0.5 mm or less.

The acid for dissolving an ITO sintered body is for example, hydrochloric acid, sulfuric acid, nitric acid or the like. Of them, hydrochloric acid showing high rate of dissolving ITO is preferable. A case using hydrochloric acid will be described below. Dissolution may be advantageously conducted, for example, by a method in which hydrochloric acid and an ITO sintered body after grinding are charged into a reaction vessel and these are stirred.

The temperature is usually 40° C. or more, preferably 60° C. or more and 100° C. or less, preferably 80° C. or less, and the dissolution time is usually 100 hours or less, preferably 50 hours or less, further preferably 24 hours or less. It is preferable that the resulted acidic solution has an indium concentration of 200 g/L or more, further 300 g/L or more.

The above-mentioned acidic solution is, if necessary, separated into solid and liquid. Separation into solid and liquid may be advantageously conducted by filtration and the like. By solid-liquid separation, undissolved ITO sintered body fractures and ceramics particles mixed in from members of a grinding machine can be removed from an acidic solution.

The tin ion contained in the above-mentioned acidic solution and acidic solution obtained by any solid-liquid separation is usually tetravalent. As described above, a solution containing tetravalent tin ions such as the acidic solution obtained here is usually subjected to a reduction treatment.

The reduction treatment may be advantageously conducted by a method in which metal tin is added into a solution containing tetravalent tin ions. Metal tin used here usually in the form of grain of about several mm or less. Regarding the addition amount of metal tin, it is advantageous that the proportion of divalent tin ions is usually 50 wt % or more based on the total amount of tin ions contained in a solution. The reduction treatment may be advantageously conducted, for example, by a method in which metal tin of 5-fold by weight or more of tin ions in a solution is added, and the resulted mixture is kept under a condition of a temperature of usually 10° C. or more, preferably 20° C. or more and usually 90° C. or less, preferably 80° C. or less for 6 hours or more, preferably 8 hours or more. The reduction treatment is preferably conducted in an inert gas atmosphere such as $N_2$, Ar and the like.

Further, the reduction treatment may also be conducted by a method in which metal indium is added into a solution containing tetravalent tin ions. Metal indium used here is usually in the form of grain or plate of about several mm or less. It is preferable that the addition amount of metal indium is usually 1.3-fold by weight or more and 2.0-fold by weight or less of tin ions in a solution (at this amount, the surface area of metal indium is 2 $cm^2$ or more, preferably 3 $cm^2$.). The reduction treatment temperature in this operation is usually 0° C. or more, preferably 5° C. or more and usually 50° C. or less, preferably 40° C. or less. When the reduction treatment temperature is too higher, reduction of tetravalent tin does not occur, and a hydrogen gas is generated from a solution in some cases. In the method of adding metal indium, a tin ion in a solution is reduced to 0-valent, namely, to metal tin in a certain case, and in this case, the generated metal tin may be removed.

The above-mentioned reduction treatment is conducted once or twice until the proportion of divalent tin ions is usually 50 wt % or more based on the total amount of tin ions contained in a solution. If necessary, metal tin or metal indium is removed from the reduction-treated solution.

In the above-mentioned raw aqueous solution, the concentration of indium ions and the concentration of tin ions in the raw aqueous solution are controlled, if necessary. It is preferable that the content of tin oxide in the raw aqueous solution and the residual ITO powder is 2 wt % or more and 20 wt % or less in terms of oxide ($SnO_2$) based on the total amount of indium oxide ($In_2O_3$) and tin oxide ($SnO_2$). Control of the indium ion concentration or tin ion concentration in a raw aqueous solution may be advantageously conducted, for example, by a method in which a hydrochloric acid solution of indium or a hydrochloric acid solution of tin is added, or a method in which an indium chloride aqueous solution or stannous chloride aqueous solution is added.

The raw aqueous solution contains as impurities, for example, zirconium (Zr), aluminum (Al), silicon (Si), iron (Fe) and the like in some cases. In these cases, it is preferable to remove these impurities from an acidic solution by using an ion exchange resin such as a cation type ion exchange resin and anion type ion exchange resin. Particularly in the case of use of an acidic solution obtained by grinding an ITO sintered body and dissolving this ground substance in an acid, there is a high possibility that Zr, Al, Si, Fe and the like are contained as impurities, and it is preferable to remove impurities by using an ion exchange resin. Further, it is preferable to perform pH regulation on the raw aqueous solution. pH regulation may be advantageously conducted under a condition producing no solid (deposit), and the allowable range of pH is from 0 to 1. pH regulation here may be advantageously conducted usually by a method in which an alkali is added. In the raw aqueous solution, a phenomenon in which pH changes steeply at the initial stage of mixing is observed in mixing of an alkali aqueous solution as described later, and steep pH change can be suppressed by pH regulation before mixing with an alkali aqueous solution in some cases.

The divalent tin ion contained in a raw aqueous solution is easily oxidized to be a tetravalent tin ion when the raw aqueous solution is left in air. When a raw aqueous solution is preserved transiently, it is preferable that a raw aqueous solution is placed in a sealable vessel, or preservation is conducted in an inert atmosphere.

The above-mentioned raw aqueous solution is mixed and reacted with an alkali aqueous solution to obtain a precipitate containing indium and tin.

The alkali aqueous solution used here is, for example, a sodium hydroxide aqueous solution, potassium hydroxide aqueous solution, ammonia water or the like, preferably a sodium hydroxide aqueous solution, potassium hydroxide aqueous solution. The concentration of a sodium hydroxide aqueous solution or potassium hydroxide aqueous solution is usually about 10 wt % or more and about 50 wt % or less. The concentration of ammonia water is usually about 10 wt % or more and about 28 wt % or less.

Mixing may be advantageously conducted, for example, by a method in which water is charged into a vessel, then, a raw aqueous solution and alkali aqueous solution are fed. Specifically, mixing may be advantageously conducted by a method in which water is charged into a vessel, then, a raw aqueous solution is fed while stirring, and pH of slurry in the vessel is measured, and an alkali aqueous solution in necessary amount is fed so that this pH is substantially 4 or more and 7 or less. If pH of slurry in the vessel is over 7 in mixing, the solid-liquid separation property of the resulting slurry is not good and a longer period of time is necessary for solid-liquid separation, and the pulverizing property of a dry solid substance obtained by solid-liquid separation is not good. On the other hand, if pH of slurry in the vessel is less than 4, a condition occurs under which indium is dissolved in large amount from precipitate into liquid, and the yield of ITO decreases.

Water charged into a vessel is, for example, distilled water, ion exchange water or the like, and it is preferable that its temperature is 40° C. or more and less than 100° C. When the temperature is less than 40° C., the solid-liquid separation property of the resulting slurry is not good, or the pulverizing property of solid resulted by solid-liquid separation is not good.

Feeding of a raw aqueous solution may be advantageously conducted for usually 10 minutes or more, preferably 20 minutes or more and 300 minutes or less, preferably 200 minutes or less. When the feeding time is over 300 minutes, primary particles are hardly agglomerated in the finally obtained ITO powder, and pulverizing thereof is difficult, in some cases.

The precipitate obtained by mixing of a raw aqueous solution and an alkali aqueous solution is, if necessary, subjected to aging. Aging may be advantageously conducted by a method in which a slurry containing solid is kept at given temperature (while stirring, or allowed to stand still). The aging temperature is preferably the same as the reaction temperature, and for example, preferably 40° C. or more and less than 100° C. By aging, the particle size of precipitate is uniformalized.

A slurry obtained by mixing of a raw aqueous solution and an alkali aqueous solution or a slurry containing precipitate subjected to optional aging is subjected to solid-liquid separation. Solid-liquid separation may be advantageously conducted by suction filtration, filtration under press, centrifugal separation, filter press and the like.

Precipitate obtained by solid-liquid separation is, if necessary, washed. Washing may be advantageously conducted using water such as distilled water, ion exchange water, and ammonia water. By washing, salts of alkali metals such as sodium and potassium can be removed. When washed using ammonia water, washing can be conducted efficiently, and the washing time can be reduced. pH of ammonia water in this operation is preferably 8 or more, further 9.5 or more and 12 or less, further 9.5 or less. When pH of ammonia water is higher than 12, there is a tendency that precipitate obtained by solid-liquid separation is re-dissolved, and the ammonia concentration in the washed drain increases, and the treatment cost increases.

It is preferable that washing is conducted so that the alkali metal content of the resulted precipitate is 200 wt ppm or less, further 100 wt ppm or less based on dry weight. When a raw aqueous solution prepared by using hydrochloric acid, and an alkali aqueous solution are reacted, it is preferable that the reaction is conducted so that the chlorine content of the resulted precipitate is 10000 wt ppm or less, further 5000 wt ppm or less based on dry weight. For attaining this, it is usually preferable to conduct washing until the alkali aqueous metal ion concentration in the washed drain becomes 200 mg/L or less, further 100 mg/L or less, particularly 50 mg/L or less. On the other hand, it is preferable to conduct washing until the chlorine ion concentration in the washed drain becomes 200 mg/L or less, further 100 mg/L or less, particularly 50 mg/L or less.

Precipitate obtained by solid-liquid separation or precipitate subjected to optional washing is, if necessary, dried. Drying is usually conducted at a temperature usually of 90° C. or more and 200° C. or less. The dried precipitate has a BET specific surface area of usually 30 $m^2/g$ or less, and can be easily pulverized. The dried precipitate obtained here is guessed to be one obtained by very weak agglomeration of particles.

As described above, when a raw aqueous solution having a proportion of divalent tin ions in the total amount of tin ions of less than 50 wt % and an alkali aqueous solution are mixed, hardly agglomerated particles are contained in the finally obtained ITO powder (in this case, dried precipitate has a BET specific surface area of over 50 $m^2/g$ and is one which obtained by strong agglomeration of particles.).

Precipitate obtained by solid-liquid separation or precipitate subjected to optional washing or drying is calcinated. Calcination is conducted usually at a temperature of 600° C. or more, preferably 800° C. or more and 1300° C. or less, preferably 1200° C. or less. The calcination time is preferably 1 minute or more, further, 10 minutes or more.

Calcination is conducted in an atmosphere, for example, containing a hydrogen halide, halogen, air, oxygen, nitrogen or argon, and the pressure of the atmosphere is usually 0.08 MPa or more and 0.12 MPa or less. The hydrogen halide in this case is hydrogen chloride, hydrogen bromide, hydrogen iodide or the like, and preferably hydrogen chloride. The halogen is chlorine, bromine, iodine or the like, and preferably chlorine. Calcination is preferably conducted in an atmosphere containing a hydrogen halide and/or halogen at least in a maintaining process among heating period, retention period and cooling period. By calcinating in an atmosphere containing a hydrogen halide and/or halogen, an ITO powder suitable for production of an ITO sintered body having higher density is obtained.

In the case of calcination in an atmosphere containing a hydrogen halide and/or halogen, the total content of hydrogen halides and halogens is usually 1 vol % or more, preferably 5 vol % or more and usually 70 vol % or less, preferably 50 vol % or less, further preferably 20 vol % or less, based on the total volume of the atmosphere.

In the case of calcination in an atmosphere containing a hydrogen halide and/or halogen, it is preferable that a hydrogen halide or halogen gas is introduced at 600° C. or more in a heating period. When a hydrogen halide or halogen gas is introduced at temperatures of less than 600° C., the vaporization amount of ITO increases and the yield decreases, in some cases. In a cooling period, it is preferable that, after termination of introduction of a hydrogen halide or halogen gas, an inert gas such as argon, and nitrogen, oxygen, air or a mixed gas thereof is fed.

Calcination may be advantageously conducted using a commercially available calcination furnace. Particularly in the case of use of a hydrogen halide gas and/or a halogen gas, it is preferable that the calcination furnace (body; accessories such as crucible, boat and the like) is constituted of a material not corroded by a hydrogen halide gas or halogen gas, for example, alumina, quartz, acid-resistant brick, graphite and the like, and it is preferable that the calcination furnace shows gas-tightness. Further, it is desirable that the calcination furnace has a structure capable of controlling an atmosphere.

Calcination is preferably conducted continuously, and for example, preferably conducted in a continuous mode calcination furnace such as a tunnel furnace.

The ITO particles obtained by the production method of the present invention described above are constituted of uniform primary particles having a BET specific surface area diameter (value obtained from BET specific surface area of ITO powder, and theoretical density of ITO) of preferably 0.05 µm or more and 1 µm or less, further preferably 0.1 µm or more and 0.5 µm or less. Agglomeration of these primary particles is loose, and suitable for sintering.

When this ITO powder contains an alkali such as an alkali halide on its surface, it is preferable to wash an ITO powder with water. By washing, the alkali content can be decreased, and for example, the alkali content can be decreased to 10 ppm or less, and an ITO powder having a purity of 99.99% or more can be obtained.

Washing in this case may be advantageously conducted, for example, by a method in which an ITO powder after calcination is added and dispersed while stirring into water, the resulted slurry is solid-liquid separated, then, water is poured on the resulted wet cake, and other methods. Solid-liquid separation in this operation may be advantageously conducted by suction filtration, filtration under press, centrifugal separation, filter press and the like. It is preferable that pH of a slurry is controlled to 6 or more, further 7 or more and 9 or less, further 8 or less before solid-liquid separation. By controlling pH of a slurry, a solid-liquid separation property becomes good and solid-liquid separation can be conducted efficiently, and filtration can be conducted in a short period of time.

This ITO powder (or washed ITO powder) is, if necessary, pulverized. Pulverizing may be advantageously conducted by using a grinding machine such as a vibration mill, ball mill, jet mill. The ITO powder obtained in the method of the present invention is easily pulverized by, for example, a ball mill, jet mill and the like since agglomeration of primary particles of the ITO powder is loose. Pulverizing by a ball mill may be conducted by a dry method or wet method, or by a combination thereof.

In the grinding machine, for example, the body (vessel) is made of alumina, resin or the like, and the medium (ball) is made of alumina, zirconia, resin or the like. From the standpoint of decrease in contamination on an ITO powder, it is preferable that the body is made of a resin and the medium is made of zirconium. By optimizing the pulverizing conditions of a ball mill, for example, rotation speed, pulverizing time and the like, an ITO powder of high density is obtained.

EXAMPLES

The following examples will illustrate the present invention further in detail below, but do not limit the scope of the invention.

Measurements of various physical properties in the present invention were conducted as described below.

1. Analysis of Liquid
(1) Concentration of Divalent Tin ($Sn^{2+}$)

It was measured according to an iodine titration method or calculated from weight loss of tin metal based on the reaction equation of reduction treatment; $Sn+Sn^{4+} \rightarrow 2Sn^{2+}$ (2) Concentration of Tin ($Sn^{4+}+Sn^{2+}$)
It was measured according to JIS M 8101.
(3) Concentration of Indium (In)
It was measured by using a ICP emission analyzer.

2. Analysis of Solid
(1) Average Particle Size (µm):

Accumulated particle size distribution was measured using a laser scattered particle size distribution measuring apparatus (manufactured by Shimadzu Corp., SALD-2000 A type), and the particle size at 50 wt % accumulation was used as an average particle size.

(2) BET Specific Surface Area ($m^2$/g), BET Specific Surface Area Diameter (µm):

A BET specific surface area was measured using a BET specific surface area measuring apparatus (manufactured by Shimadzu Corp., Flow Sorb II 2300 type). The BET specific surface area diameter (DBET) was calculated according to the following formula.

DBET (µm)=$6/(S \times \rho)$

S=BET specific surface area ($m^2$/g)
ρ=theoretical density of ITO (g/cm$^3$)
If the tin oxide content of ITO is 10 wt %=($SnO_2/(In_2O_3+SnO_2))\times 100$, ρ is 7.16 g/cm$^3$.

(3) Chlorine Content

The chlorine content in an ITO powder was obtained by allowing a gas generated in reducing an ITO powder with hydrogen to be absorbed in a water trap and measuring the chlorine content in the trap by ion chromatography.

Example 1

[Preparation of Raw Aqueous Solution]

Into 5151 g of an indium chloride aqueous solution (indium concentration: 23.3 wt %) prepared by dissolving metal indium (purity: 99.999 wt %) in 35 wt % hydrochloric acid was mixed 526 g of a tin chloride aqueous solution (tin concentration: 23.3 wt %) prepared by dissolving metal tin (purity: 99.995 wt %) in 35 wt % hydrochloric acid. In this raw aqueous solution, the proportion of divalent tin ions (Sn 2+) based on the total amount tin ions was 85.3 wt %, and the content of tin oxide was 10 wt %=$[SnO_2/(In_2O_3+SnO_2)]\times 100$, based on the total amount of indium oxide and tin oxide. To the raw aqueous solution was added a 25 wt % sodium hydroxide aqueous solution to regulate pH to 0.5.

[Mixing of Raw Aqueous Solution and Alkali Aqueous Solution]

Into a 20 L vessel was charged 6 kg of ion exchange water and the water temperature was maintained at 55° C. Into the vessel, the above-mentioned raw aqueous solution and 25 wt % sodium hydroxide aqueous solution were fed for 114 minutes while stirring. During this reaction, pH of slurry in the vessel was kept at 5.5, and the temperature was 55° C. Thereafter, the temperature of slurry in the vessel was maintained at 55° C. for 30 minutes while stirring, then, a 25 wt % sodium hydroxide aqueous solution was added to regulate pH to 8.0.

[Solid-Liquid Separation (Filtration)]

The resulted slurry was solid-liquid separated by suction filtration. To the precipitate on filter paper of the filtering apparatus, 5.8 kg of alkali water prepared by adding ammonia water to ion exchange water to give a pH of 10 was poured five times in total (total water amount: 29 kg) to wash the precipitate. In the washed drain at fifth washing, the sodium concentration was 3.8 mg/L and the chlorine ion concentration was 28 mg/L. The washed precipitate was dried at 140° C. The dried precipitate had a BET specific surface area of 13 m²/g, a sodium content of 7 wt ppm and a chlorine content of 5000 wt ppm.

[Calcination]

500 g of the dried precipitate was charged in a boat made of quartz glass under a condition of a charging depth of about 50 mm, and this boat was placed in a tubular furnace (furnace center tube: quartz glass, manufactured by Tokyo Rika Yogyo sha K.K.). In calcination:

heating rate: 5° C./minute, in heating period from room temperature to 1000° C.: air was fed to a furnace center tube, in heating period from 1000° C. to 1100° C. and in retention period at 1100° C.: feeding of air was stopped, and a mixed gas of hydrogen chloride 10 vol %-air 90 vol % was fed to a furnace center tube, retention time at 1100° C.: 40 minutes.

As hydrogen chloride gas, bomb hydrogen chloride gas (purity: 99.9%, manufactured by Tsurumi Soda K.K.) was used. Control of the gas concentration of an atmosphere was conducted by a method in which the flow rate of a gas fed to a furnace center was controlled by a flow rate meter. Then, feeding of a mixed gas to a furnace center tube was stopped, and the furnace was cooled to room temperature while feeding air, and calcined powder was obtained in the quartz glass boat.

[Washing]

Into the resulted calcined powder was mixed ion exchange water in an amount of 3-fold by weight, the mixture was stirred for 30 minutes, then, ammonia water was added to this to regulate pH to 8 to 9, then, suction filtration was effected, and ion exchange water was poured onto wet cake on filter paper of a filtering apparatus until the chlorine ion concentration of the filtrated washed drain was 1 mg/L or less, to wash the solid. The washed wet cake was dried at 130° C. The resulted ITO powder had an average particle size of 5.1 µm, a chlorine content of less than 10 ppm, a BET specific surface area of 3.0 m²/g, and a BET specific surface area diameter of 0.28 µm.

[Pulverizing]

Into a 500 mL polyethylene ball mill plot was charged 100 g of the above-mentioned ITO powder, 100 g of ethanol and 1000 g of zirconia balls having a diameter of 5 mm, and pulverizing was conducted at 100 rpm for 8 hours, and the mixture was dried under reduced pressure. This resulted ball-milled ITO powder had an average particle size of 0.9 µm, a BET specific surface area of 3.7 m²/g, and a BET specific surface area diameter of 0.23 µm.

[Evaluation of Physical Property of ITO Powder]

The above-mentioned powder was uni-axially molded under a molding pressure of 10 MPa (100 kg/cm²), then, subjected to CIP under a molding pressure of 250 MPa (2.5 ton/cm²), to obtain a molded body. This molded body was sintered by maintaining at 1500° C. for 3 hours in an oxygen atmosphere of normal pressure. The resulted ITO sintered body had a density of 7.12 g/cm³ (99.4% of theoretical density)

Example 2

An indium chloride aqueous solution prepared by dissolving metal indium in 35 wt % hydrochloric acid, a stannic chloride (SnCl₄) aqueous solution and 35 wt % hydrochloric acid were mixed, to obtain an aqueous solution having an indium concentration of 110 g/L, a tin concentration of 12 g/L and a hydrogen ion concentration of 0.9 mol/L. To 526 mL of this aqueous solution was added 121.4 g of metal tin, and the mixture was maintained in a nitrogen ($N_2$) atmosphere of 70° C. for 7 hours to dissolve metal tin, and tetravalent tin ions ($Sn^{4+}$) in the aqueous solution were reduced to divalent tin ions ($Sn^{2+}$), then, undissolved metal tin was removed, to obtain an aqueous solution having a proportion of divalent tin ions ($Sn^{2+}$) in the total amount of tin ions of 99 wt %(calculated value). To this aqueous solution was added an indium chloride aqueous solution to obtain a raw aqueous solution in which the content of tin oxide was 10 wt % based on the total amount of indium oxide and tin oxide. To this raw aqueous solution was added a 25 wt % sodium hydroxide aqueous solution to regulate pH, to obtain 720 mL of an aqueous solution having a pH of 0.2, an indium concentration of 159 g/L and a tin concentration of 17 g/L.

Into a 2 L vessel was charged 600 g of ion exchange water, and the water temperature was maintained at 60° C. Into the vessel, the above-mentioned raw aqueous solution and 25 wt % sodium hydroxide aqueous solution were fed for 60 minutes while stirring. During this reaction, the pH of slurry in the vessel was maintained at 5.5. Thereafter, the temperature of slurry in the vessel was maintained at 60° C. for 30 minutes while stirring, then, a 25 wt % sodium hydroxide aqueous solution was added to this to regulate pH to 8.0, then, the liquid temperature was controlled to 40° C., then, pH was regulated to 10.0.

The resulted slurry was solid-liquid separated by suction filtration. To the precipitate on filter paper of the filtering apparatus, 580 g of alkali water prepared by adding ammonia water to ion exchange water to give a pH of 10 was poured seven times in total to wash the precipitate. In the washed drain at seventh washing, the chlorine ion concentration was 87 mg/L.

The washed precipitate was dried at 140° C. The dried substance had an average particle size of 5.0 µm, and a BET specific surface area of 16 m²/g, and could be easily pulverized. The above-mentioned dried precipitate was calcinated in the same operation as in [Calcination] of Example 1 except that heating rate: 5° C./minute, in heating period from room temperature to 1090° C.: air was fed to a furnace center tube, in retention period at 1090° C.: feeding of air was stopped, and a mixed gas of hydrogen chloride 10 vol %-air 90 vol % was fed to a furnace center tube, retention time at 1090° C.: 60 minutes.

The resulted calcined powder was washed in the same manner as in [Washing] of Example 1 to obtain an ITO powder. The resulted ITO powder had an average particle size of 4.2 µm, a BET specific surface area of 3.8 m²/g, and a BET specific surface area diameter of 0.2 µm.

The ITO powder was ball-milled in the same operation as in [Pulverizing] of Example 1. The resulted ball-milled ITO powder had an average particle size of 0.8 µm, a BET specific surface area of 5.0 m²/g, and a BET specific surface area diameter of 0.17 µm.

The ball-milled ITO powder was evaluated in the same manner as in [Evaluation of physical property of ITO powder] of Example 1. The resulted ITO sintered body had a density of 7.11 g/cm³ (99.3% of theoretical density).

Example 3

Into a 1 L separable flask was charged 143.8 g of a mixed hydroxide of indium and tin (indium content: 90.1 g, tin content: 8.8 g) and 45.6 g of metal tin (purity: 99.995%), then, 268 ml 35 wt % hydrochloric acid was added, and the mixture was maintained at 75° C. for 6 hours. Thereafter, undissolved metal tin was removed from the aqueous solution, to obtain an aqueous solution having a proportion of divalent tin ions ($Sn^{2+}$) in the total amount of tin ions of 83 wt %(calculated value). To this aqueous solution was added an indium chloride aqueous solution to obtain a raw aqueous solution in which the content of tin oxide was 10 wt % based on the total amount of indium oxide and tin oxide. To this raw aqueous solution was added a 25 wt % sodium hydroxide aqueous solution to control pH, to obtain an aqueous solution having a pH of 0.2, an indium concentration of 17.0 wt % and a tin ion concentration of 1.8 wt %.

Into a 2 L vessel was charged 600 g of ion exchange water, and the water temperature was maintained at 60° C. Into the vessel, 703.4 g of the above-mentioned raw aqueous solution and 25 wt % sodium hydroxide aqueous solution were fed for 60 minutes while stirring. During this reaction, the pH of slurry in the vessel was maintained at 5.5. Thereafter, the temperature of slurry in the vessel was maintained at 60° C. for 30 minutes while stirring, then, a 25 wt % sodium hydroxide aqueous solution was added to this to control pH to 9.8.

The resulted slurry was solid-liquid separated by suction filtration. To the precipitate on filter paper of the filtering apparatus, 580 g of alkali water prepared by adding ammonia water to ion exchange water to give a pH of 10 was poured five times in total to wash the precipitate. In the washed drain at fifth washing, the chlorine ion concentration was 20 mg/L.

The washed precipitate was dried at 130° C. The dried substance had an average particle size of 4.5 μm, and a BET specific surface area of 17 $m^2/g$, and could be easily pulverized. The above-mentioned dried substance was calcinated in the same operation as in [Calcination] of Example 1 except that heating rate: 5° C./minute, in heating period from room temperature to 1090° C.: air was fed to a furnace center tube, in retention period at 1090° C.: feeding of air was stopped, and a mixed gas of hydrogen chloride 10 vol %-air 90 vol % was fed to a furnace center tube, retention time at 1090° C.: 60 minutes.

The resulted calcined powder was washed in the same manner as in [Washing] of Example 1 to obtain an ITO powder. The resulted ITO powder had an average particle size of 4.0 μm, a BET specific surface area of 3.7 $m^2/g$, and a BET specific surface area diameter of 0.23 μm.

The ITO powder was ball-milled in the same operation as in [Pulverizing] of Example 1. The resulted ball-milled ITO powder had an average particle size of 0.8 μm, a BET specific surface area of 4.8 $m^2/g$, and a BET specific surface area diameter of 0.17 μm.

The ball-milled ITO powder was evaluated in the same manner as in [Evaluation of physical property of ITO powder] of Example 1. The resulted ITO sintered body had a density of 7.10 $g/cm^3$ (99.1% of theoretical density).

Comparative Example 1

2072 g of a mixed hydroxide of indium and tin (indium content: 90.1 g, tin content: 8.8 g) was dissolved in 3845 g of 35 wt % hydrochloric acid, to obtain an aqueous solution having a proportion of divalent tin ions ($Sn^{2+}$) in the total amount of tin ions of 0 wt %. To this raw aqueous solution was added a 25 wt % sodium hydroxide aqueous solution to regulate pH to 0.4.

Into a 20 L vessel was charged 6 kg of ion exchange water, and the water temperature was maintained at 55° C. Into the vessel, the above-mentioned raw aqueous solution and 25 wt % sodium hydroxide aqueous solution were fed for 121 minutes while stirring. During this reaction, the pH of slurry in the vessel was maintained at 5.5. Thereafter, the temperature of slurry in the vessel was maintained at 55° C. for 30 minutes while stirring, then, a 25 wt % sodium hydroxide aqueous solution was added to this to regulate pH to 8.0.

The resulted slurry was solid-liquid separated by suction filtration. To the precipitate on filter paper of the filtering apparatus, 5.8 kg of alkali water prepared by adding ammonia water to ion exchange water to give a pH of 10 was poured five times in total to wash the precipitate. In the washed drain at fifth washing, the sodium ion concentration was 58 mg/L and the chlorine ion concentration was 58 mg/L.

The washed precipitate was dried at 140° C. The dried precipitate had an average particle size of 3.08 μm, a BET specific surface area of 54 $m^2/g$, a sodium content of 150 wt ppm and a chlorine content of 2800 wt ppm.

The above-mentioned dried substance was calcinated in the same operation as in Example 1.

The resulted calcined powder was washed in the same manner as in [Washing] of Example 1 to obtain an ITO powder. The resulted ITO powder had a sodium content of 63 wt ppm, an average particle size of 1.6 μm, a BET specific surface area of 3.3 $m^2/g$, and a BET specific surface area diameter of 0.26 μm.

The ITO powder was ball-milled in the same operation as in [Pulverizing] of Example 1. The resulted ball-milled powder had an average particle size of 1.0 μm, a BET specific surface area of 3.9 $m^2/g$, and a BET specific surface area diameter of 0.21 μm.

The ball-milled ITO powder was evaluated in the same manner as in [Evaluation of physical property of ITO powder] of Example 1. The resulted ITO sintered body had a density of 6.84 $g/cm^3$ (95.6% of theoretical density).

Example 4

814 g of used ITO target ground article (size; about 10 to 20 mm square) and 716 g of a 35 wt % hydrochloric acid aqueous solution were charged into a 2 L separable flask, they were dissolved at 80° C. for 40 hours, then, undissolved ITO was removed to obtain an aqueous solution having an indium concentration of 311 g/L, a tin concentration of 34 g/L, a zirconium concentration of 0.0354 g/L and a hydrogen ion concentration of 3.20 mol/L. This aqueous solution was diluted with ion exchange water to regulate the hydrogen ion concentration to 1.4 mol/L, then, passed through a column filled with a cation type ion exchange resin (trade name: Duolite C255LFH) at a flow rate of 1.5 ml/minute to remove zirconium, obtaining an aqueous solution having an indium concentration of 142 g/L, a tin concentration of 15.7 g/L and a zirconium concentration of 0.0001 g/L. To 563 mL of the resulted aqueous solution was added 177.8 g of metal tin (purity: 99.995%), and the mixture was maintained at 70° C.

for 7 hours to reduce tetravalent tin ions (Sn$^{4+}$) into divalent tin ions (Sn$^{2+}$), then, undissolved metal tin was removed, to obtain an aqueous solution having a proportion of divalent tin ions (Sn$^{2+}$) in the total amount of tin ions of 99 wt %(calculated value). To this aqueous solution was added an indium chloride aqueous solution to obtain a raw aqueous solution in which the content of tin oxide was 10 wt % based on the total amount of indium oxide and tin oxide. To this raw aqueous solution was added a 25 wt % sodium hydroxide aqueous solution to regulate pH, to obtain 627 mL of an aqueous solution having a pH of 0.02, an indium concentration of 191 g/L and a tin concentration of 20 g/L.

Into a 2 L vessel was charged 600 g of ion exchange water, and the water temperature was maintained at 60° C. Into the vessel, the above-mentioned raw aqueous solution and 25 wt % sodium hydroxide aqueous solution were fed for 58 minutes while stirring. During this reaction, the pH of slurry in the vessel was maintained at 5.5. Thereafter, the temperature of slurry in the vessel was maintained at 55° C. for 30 minutes while stirring, then, a 25 wt % sodium hydroxide aqueous solution was added to this to regulate pH to 9.7.

The resulted slurry was solid-liquid separated by suction filtration. To the precipitate on filter paper of the filtering apparatus, 580 g of alkali water prepared by adding ammonia water to ion exchange water to give a pH of 10 was poured five times in total to wash the precipitate. In the washed drain at fifth washing, and the chlorine ion concentration was 20 mg/L.

The washed precipitate was dried at 130° C. The dried precipitate had an average particle size of 4.4 μm, and a BET specific surface area of 22 m$^2$/g, and could be easily pulverized. The dried substance had an aluminum content of 3 wt ppm or less, a silicon content of 7 wt ppm or less, an iron content of 3 wt ppm or less, a copper content of 3 wt ppm or less, a lead content of 1 wt ppm or less and a zinc content of 3 wt ppm or less.

The above-mentioned dried substance was calcinated in the same operation as in [Calcination] of Example 1 except that heating rate: 5° C./minute, in heating period from room temperature to 1090° C.: air was fed to a furnace center tube, in retention period at 1090° C.: feeding of air was stopped, and a mixed gas of hydrogen chloride 10 vol %-air 90 vol % was fed to a furnace center tube, retention time at 1090° C.: 60 minutes.

The resulted calcined powder was washed in the same manner as in [Washing] of Example 1 to obtain an ITO powder. The ITO powder had an average particle size of 4.0 μm, a BET specific surface area of 3.9 m$^2$/g, and a BET specific surface area diameter of 0.21 μm. The ITO powder had an aluminum content of 5 wt ppm or less, a silicon content of 42 wt ppm or less, an iron content of 5 wt ppm or less, a copper content of 5 wt ppm or less, a lead content of 1 wt ppm or less and a zinc content of 5 wt ppm or less, and a purity of 99.99 wt % or more.

The ITO powder was ball-milled in the same operation as in [Pulverizing] of Example 1. The pulverized article had an average particle size of 0.9 μm, a BET specific surface area of 5.1 m$^2$/g, and a BET specific surface area diameter of 0.16 μm.

The ball-milled ITO powder was evaluated in the same manner as in [Evaluation of physical property of ITO powder] of Example 1. The resulted ITO sintered body had a density of 7.14 g/cm$^3$ (99.3% of theoretical density).

Comparative Example 2

814 g of used ITO target ground article (size; about 10 to 20 mm square) and 716 g of a 35 wt % hydrochloric acid aqueous solution were charged into a 2 L separable flask, they were dissolved at 80° C. for 40 hours, then, undissolved ITO was removed to obtain an aqueous solution having an indium concentration of 311 g/L, a tin concentration of 34 g/L, a zirconium concentration of 0.0354 g/L and a hydrogen ion concentration of 3.20 mol/L. This aqueous solution was diluted with ion exchange water to regulate the hydrogen ion concentration to 1.0 mol/L, then, passed through a column filled with a cation type ion exchange resin (trade name: Monosphere 650° C.) at a flow rate of 1.5 ml/minute to remove zirconium, obtaining an aqueous solution having an indium concentration of 214 g/L, a tin concentration of 23 g/L and a zirconium concentration of 0.001 g/L. To 715 mL of the resulted aqueous solution was added 35 wt % hydrochloric acid without reduction treatment to control pH, to obtain 890 mL of an aqueous solution having a pH of 0.4, an indium concentration of 172 g/L and a tin concentration of 19 g/L.

Into a 5 L vessel was charged 765 g of ion exchange water, and the water temperature was maintained at 60° C. Into the vessel, the above-mentioned raw aqueous solution and 25 wt % sodium hydroxide aqueous solution were fed for 120 minutes while stirring. During this reaction, the pH of slurry in the vessel was maintained at 5.5. Thereafter, the temperature of slurry in the vessel was maintained at 55° C. for 30 minutes while stirring, then, a 25 wt % sodium hydroxide aqueous solution was added to this to regulate pH to 8.

The resulted slurry was solid-liquid separated by suction filtration. To the precipitate on filter paper of the filtering apparatus, 740 g of alkali water prepared by adding ammonia water to ion exchange water to give a pH of 10 was poured seven times in total to wash the precipitate. In the washed drain at seventh washing, the sodium ion concentration was 7.6 mg/L and the chlorine ion concentration was 49 mg/L.

The washed precipitate was dried at 130° C. The dried precipitate had an average particle size of 5.0 μm, and a BET specific surface area of 58 m$^2$/g, and could be easily pulverized. However, this dried substance was in the form of strongly agglomerated bulk, and could not be easily pulverized.

The above-mentioned dried substance was calcinated in the same operation as in [Calcination] of Example 1 except that heating rate: 5° C./minute, in heating period from room temperature to 1050° C.: air was fed to a furnace center tube, in heating period from 1050° C. to 1100° C.: feeding of air was stopped, and a mixed gas of hydrogen chloride 10 vol %-air 90 vol % was fed to a furnace center tube, retention time at 1140° C.: 40 minutes.

The resulted calcined powder was washed in the same manner as in [Washing] of Example 1 to obtain an ITO powder. The resulted ITO powder had an average particle size of 4.5 μm, a BET specific surface area of 2.6 m$^2$/g, and a BET specific surface area diameter of 0.32 μm.

The ITO powder was ball-milled in the same operation as in [Pulverizing] of Example 1. The resulted ball-milled powder had an average particle size of 1.1 μm, a BET specific surface area of 4.0 m$^2$/g, and a BET specific surface area diameter of 0.21 μm.

The ball-milled ITO powder was evaluated in the same manner as in [Evaluation of physical property of ITO powder] of Example 1. The resulted ITO sintered body had a density of 6.90 g/cm$^3$ (96.4% of theoretical density).

When the ITO powder obtained by the production method of the present invention is used as a raw powder for production of an ITO sintered body, an ITO sintered body of high density is obtained, and when the resulted sintered body is used as a sputtering target, an ITO thin film having high electric conductivity can be obtained. The ITO powder obtained by the production method of the present invention is composed of uniform and fine primary particles, and suitable for application as transparent and electrically conductive fillers.

What it claimed is:

1. A method of producing an Indium Tin Oxide powder comprising the steps of:
    (1) preparing a raw aqueous solution by reduction-treating an aqueous solution containing indium ions and tetravalent tin ions
    (2) mixing a raw aqueous solution containing indium ions and tin ions and having a proportion of divalent tin ions in the tin ions of 50 wt % or more with an alkali aqueous solution,
    (3) separating the product into solid and liquid, and
    (4) calcinating the resulted solid.

2. The production method according to claim 1 wherein the step (1) includes feeding a raw aqueous solution containing indium ions and tin ions and having a proportion of divalent tin ions in the tin ions of 50 wt % or more and an alkali aqueous solution to water of 40° C. or more and less than 100° C., and reacting the raw aqueous solution and the alkali aqueous solution under a condition of a pH of 4 or more and 7 or less.

3. The production method according to claim 1 wherein the raw aqueous solution is prepared by dissolving a water-soluble indium salt selected from indium chloride and indium nitrate and a water-soluble divalent tin salt in water.

4. The production method according to claim 1 wherein the raw aqueous solution is prepared by dissolving a water-soluble indium salt and a water-soluble divalent tin salt selected from stannous chloride and tin sulfate.

5. The production method according to claim 1 wherein the raw aqueous solution is prepared by dissolving a substance containing indium, tin and oxygen in an acid.

6. The production method according to claim 1 wherein the raw aqueous solution is prepared by dissolving a substance containing indium, tin and oxygen in hydrochloric acid.

7. The production method according to claim 1 wherein the raw aqueous solution is prepared by dissolving a mixture of an indium compound selected from indium oxide and indium hydroxide and a tin compound selected from tin oxide and tin hydroxide in an acid or dissolving Indium Tin Oxide in an acid.

8. The production method according to claim 1 wherein the raw aqueous solution is prepared by dissolving a mixture of an indium compound selected from indium oxide and indium hydroxide and a tin compound selected from tin oxide and tin hydroxide in hydrochloric acid or dissolving Indium Tin Oxide in hydrochloric acid.

9. The production method according to claim 1 wherein the content of tin oxide in the raw aqueous solution in the step (1) is 2 wt % or more and 20 wt % or less based on the total amount of indium oxide and tin oxide.

10. The production method according to claim 1 wherein the raw aqueous solution is allowed to contact with an ion exchange resin.

11. The production method according to claim 1 wherein the calcination is conducted in an atmosphere containing a hydrogen halide and/or a halogen in which the total content thereof is 1 volume % or more and under a condition of a temperature of 600° C. or more and 1300° C. or less.

12. The production method according to claim 1 wherein the alkali aqueous solution is an aqueous solution of sodium hydroxide and/or potassium hydroxide.

13. A method of producing an Indium Tin Oxide powder comprising the steps of:
    (1) mixing a raw aqueous solution containing indium ions and tin ions and having a proportion of divalent tin ions in the tin ions of 50 wt % or more with an alkali aqueous solution,
    (2) separating the product into solid and liquid, and
    (3) calcinating the resulted solid,
    wherein the content of tin oxide in the raw aqueous solution in the step (1) is 2 wt % or more and 20 wt % or less based on the total amount of indium oxide and tin oxide.

14. A method of producing an Indium Tin Oxide powder comprising the steps of:
    (1) mixing a raw aqueous solution containing indium ions and tin ions and having a proportion of divalent tin ions in the tin ions of 50 wt % or more with an alkali aqueous solution,
    (2) separating the product into solid and liquid, and
    (3) calcinating the resulted solid,
    wherein the raw aqueous solution is allowed to contact with an ion exchange resin.

* * * * *